(12) United States Patent
Matsuda (10) Patent No.: US 7,723,735 B2
(45) Date of Patent: May 25, 2010

(54) DISPLAY DEVICE AND A METHOD OF MANUFACTURING THE SAME

(75) Inventor: Eisuke Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/279,930

(22) Filed: Apr. 17, 2006

(65) Prior Publication Data

US 2006/0231830 A1 Oct. 19, 2006

(30) Foreign Application Priority Data

Apr. 18, 2005 (JP) .......................... P2005-119156

(51) Int. Cl.
H01L 27/15 (2006.01)

(52) U.S. Cl. .......... 257/88; 257/E33.041; 257/E27.117; 257/E25.02; 257/E51.022; 438/35

(58) Field of Classification Search .................. 438/35, 438/FOR. 341; 257/89, E51.022, E33.014, 257/E27.117, E25.02
See application file for complete search history.

(56) References Cited

U.S. PATENT DOCUMENTS

| 5,043,715 | A * | 8/1991 | Kun et al. ..................... 345/76 |
| 6,191,764 | B1 * | 2/2001 | Kono et al. ................... 345/76 |
| 6,633,122 | B2 * | 10/2003 | Kijima et al. ................. 313/506 |
| 6,699,597 | B2 * | 3/2004 | Bellmann et al. ............ 428/690 |
| 6,863,961 | B2 | 3/2005 | Miyashita et al. |
| 7,038,373 | B2 * | 5/2006 | Arnold et al. ................. 313/506 |
| 7,050,697 | B1 * | 5/2006 | Stevenson ..................... 385/147 |
| 7,615,790 | B2 * | 11/2009 | Lee ................................. 257/79 |
| 2001/0001050 | A1 * | 5/2001 | Miyashita et al. ........... 428/690 |
| 2001/0036561 | A1 * | 11/2001 | Wolk et al. .................... 428/690 |
| 2002/0015907 | A1 * | 2/2002 | Wolk et al. .................... 430/200 |
| 2003/0064248 | A1 * | 4/2003 | Wolk et al. .................... 428/690 |
| 2004/0222413 | A1 * | 11/2004 | Hsu et al. ....................... 257/40 |
| 2005/0142283 | A1 * | 6/2005 | Kishimoto ..................... 427/66 |
| 2005/0186330 | A1 | 8/2005 | Kim et al. |
| 2005/0266152 | A1 * | 12/2005 | Nguyen et al. ................ 427/66 |
| 2005/0274961 | A1 * | 12/2005 | Iou ................................. 257/82 |
| 2006/0032528 | A1 * | 2/2006 | Wang ........................... 136/263 |
| 2006/0043858 | A1 * | 3/2006 | Ikeda et al. ................... 313/250 |
| 2006/0134458 | A1 * | 6/2006 | Kawamura .................... 428/690 |
| 2006/0175958 | A1 * | 8/2006 | Gerhard et al. .............. 313/504 |
| 2007/0200123 | A1 * | 8/2007 | Yamamichi et al. ........... 257/89 |
| 2007/0228399 | A1 * | 10/2007 | Iwawaki et al. ................ 257/89 |
| 2008/0157657 | A1 * | 7/2008 | Matsunami et al. .......... 313/504 |
| 2009/0263924 | A1 * | 10/2009 | Lee ................................. 438/35 |

FOREIGN PATENT DOCUMENTS

| EP | 1 176 642 | 1/2002 |
| JP | 10-153967 | 6/1998 |
| JP | 2002-110350 | 4/2002 |
| JP | 2005-235741 | 9/2005 |

* cited by examiner

*Primary Examiner*—George Fourson
(74) *Attorney, Agent, or Firm*—Sonnenschein Nath & Rosenthal LLP (57) ABSTRACT

In a display device having a plurality of organic electroluminescence devices arranged on a substrate, each of the devices including a lower electrode, an organic layer at least containing a light emitting layer, and an upper electrode in this order, the light emitting layer of at least some of the organic electroluminescence devices has a first light emitting layer formed by vapor deposition and a second light emitting layer formed by thermal transfer, and the first light emitting layer emits light whose wavelength is equal to or shorter than that of blue light.

12 Claims, 3 Drawing Sheets

Fig.2

DISPLAY DEVICE AND A METHOD OF MANUFACTURING THE SAME

CROSS REFERENCE TO RELATED APPLICATIONS

The present invention contains subject matter related to Japanese Patent Application JP 2005-119156 filed in the Japanese Patent Office on Apr. 18, 2005, the entire contents of which being incorporated herein by reference.

BACKGROUND OF THE INVENTION

1. Field of the Invention

The present invention concerns a display device and a manufacturing method thereof and, more specifically, it relates to a display device capable of color display using an organic electroluminescence device and a manufacturing method thereof.

2. Description of the Related Art

In organic electroluminescence devices, organic layers such as a hole transporting layer and a light emitting layer are provided between a lower electrode and an upper electrode.

In full color display devices using the organic electroluminescence devices (hereinafter simply referred to as light emitting device), light emitting devices that emit respectively R (ref), G (green), or B (blue) are arranged on a substrate. In manufacturing such devices, it is necessary to provide a light emitting layer comprising an organic light emitting material that emits each color for each light emitting device. Each light emitting layer is provided, for example, by a shadow masking method in which a light emitting material is deposited or coated through a mask provided with a plurality of apertures, or by an ink jet method.

However, it is difficult to further refine or highly integrate the light emitting devices when using the shadow masking method because of the difficulty of refinement of the apertures of the mask due to the distortion of the mask, etc.

Further, patterning with high accuracy is difficult also in the ink jet method.

Then, as a new pattern forming method, a transfer method using an energy source (heat source) (that is, thermal transfer method) has been proposed. A display device is manufactured by the thermal transfer method, for example, as described below. At first, a lower electrode is formed on a substrate of a display device (hereinafter referred to as a device substrate). On the other hand, a light emitting layer is formed by way of a light absorption layer on another substrate (hereinafter referred as a transfer substrate). Then, the device substrate and the transfer substrate are placed in a state of opposing the light emitting layer and the lower electrode and a laser light is irradiated on the side of the transfer substrate thereby thermally transferring the light emitting layer on the lower electrode of the device substrate. In this case, by scanning a laser irradiated spotwise, the light emitting layer is thermally transferred with a good positional accuracy only to a predetermined region on the lower electrode (refer to JP-A No. 2002-110350).

SUMMARY OF THE INVENTION

However, the light emission device obtained by using the thermal transfer method described above has relatively lower light emission efficiency and shorter luminance life compared with the light emission device manufactured by the shadow masking method. This problem is serious particularly in a blue light emitting organic electroluminescence device which has the shortest luminance life among R (red), G (green), and B (blue) light emitting devices.

In view of the above, there is provided a display device using organic electroluminescence devices capable of patterning each of light emitting layers with good positional accuracy, and capable of maintaining high light emission efficiency and luminance life thereby enabling further fine display.

According to a preferred embodiment of the invention, a display device having a plurality of organic electroluminescence devices arranged on a substrate, each of the devices including a lower electrode, an organic layer at least containing a light emitting layer, and an upper electrode in this order, the light emitting layer of at least some of the organic electroluminescence devices has a first light emitting layer formed by vapor deposition and a second light emitting layer formed by thermal transfer, and the first light emitting layer emits light whose wavelength is equal to or shorter than that of blue light.

According to the preferred embodiment of the invention, each of the light emitting layers can be patterned with good positional accuracy by the thermal transfer method, and high light emission efficiency and long luminance life of the organic electroluminescence device can be obtained. Particularly, the life and the emission efficiency of the blue light emitting device which hindered longer life and higher light emission efficiency can be improved. As a result, further refinement is possible for the color display device in which the organic electroluminescence devices are arranged on the substrate.

DESCRIPTION OF THE PREFERRED EMBODIMENTS

Preferred embodiments of the invention are to be described with reference to the drawings.

First Embodiment

Figure 1:
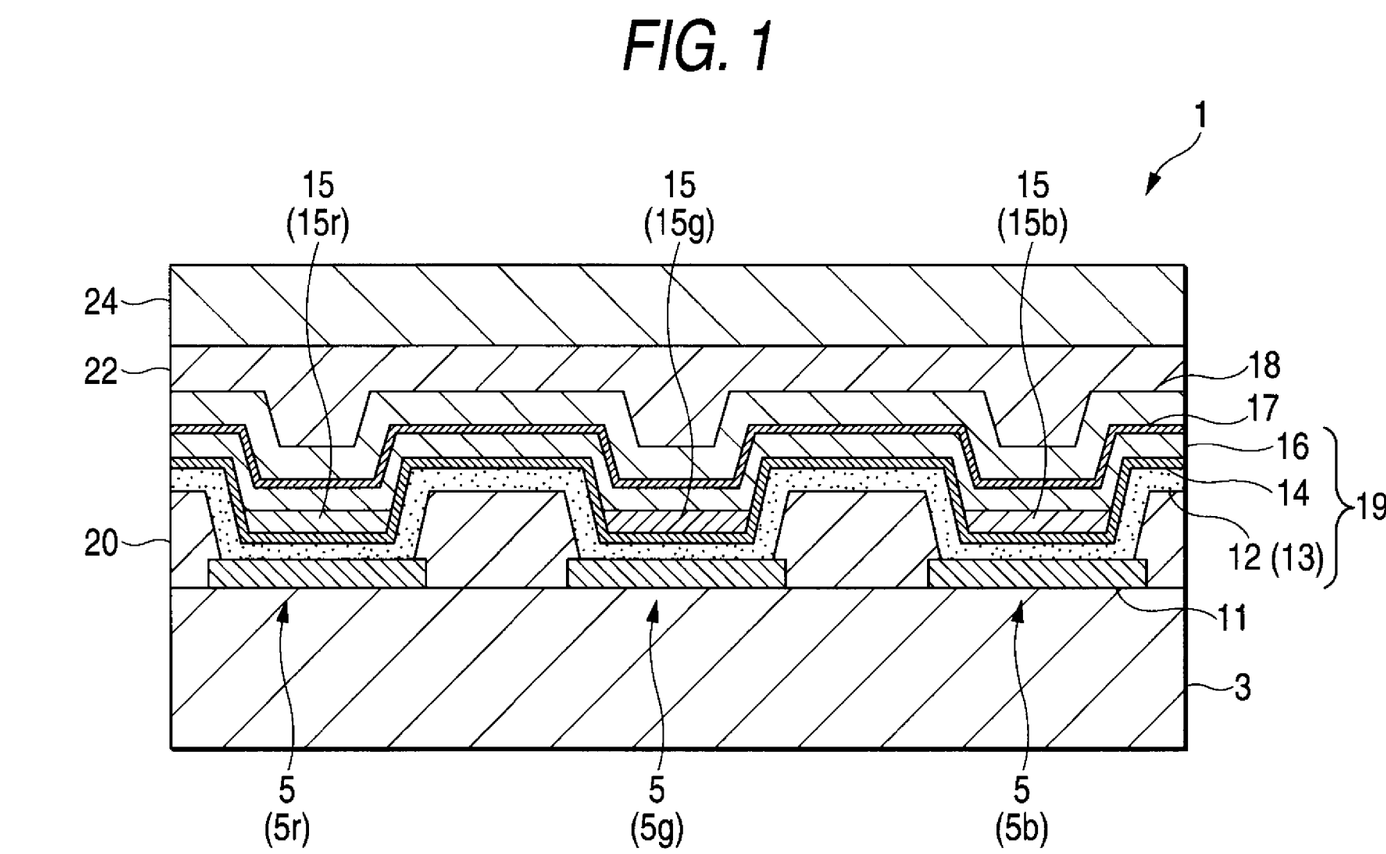
FIG. 1 is a cross sectional view showing the structure of a display device in accordance with a first embodiment.

FIG. 1 is a cross sectional view for main portion of a display device of a preferred embodiment as an example according to the invention. A display device 1 shown in the drawing is a flat panel display of full color indication in which a plurality of organic electroluminescence devices 5 (5r, 5g, and 5b) that emit respectively red (R), green (G), or blue (B) light are arranged above a substrate 3. Hereinafter, an organic electroluminescence device 5 that emits a red light is referred to as a red light emitting device 5r, an organic electroluminescence device 5 that emits a green light is referred to as a green light emitting device 5b, and an organic electroluminescence device 5 that emits a blue light is referred as the blue light emitting device 5b.

In each of the organic electroluminescence devices 5 (5r, 5g, and 5b), patterned lower electrode 11, hole injecting layer 12, hole transporting layer 13, first light emitting layer 14, second light emitting layers 15 (15r, 15g, 15b), an electron transporting layer 16, an electron injecting layer 17, and an upper electrode 18 are laminated from the side of the substrate 3. In the drawing, the hole injecting layer 12 and the hole transporting layer 13 are shown as one identical layer.

In the organic electroluminescence device 5, an organic layer 19 consisting of organic materials includes layers from the hole injecting layer 12 to the electron transporting layer 16 for example. Further, the organic electroluminescence devices 5 are separated from each other by an insulating film 20 formed between the lower electrodes 11.

In this embodiment the light emitting layer of the organic electroluminescence device 5 has a first light emitting layer 14 provided to cover substantially the whole area of the substrate 3 and a second light emitting layers 15 (15r, 15g, and 15b) provided respectively on each of the organic electroluminescence devices 5 (5r, 5g, and 5b).

The detailed structure of the display device 1 is to be described at first for the substrate 3, the lower electrode 11, and the upper electrode 18 and then the constitution of the organic layer 19 is to be described.

The substrate 3 includes, for example, a glass, silicon or plastic substrate and, further, a TFT substrate formed with TFT (Thin Film Transistor). Particularly when the light emission is taken out from the side of the substrate 3, the substrate 3 is made of a light transmitting material.

The lower electrode 11 provided on the substrate 3 is used as an anode or a cathode. In such a device as described above, the lower electrode 11 is typically the anode.

The lower electrode 11 is suitably patterned for the driving system of the display device 1. For example, when the driving system of the display device 1 is a simple matrix type, the lower electrode 11 is formed in stripes for example. Further, when the driving system of the display device 1 is an active matrix type having TFT on every pixel, the lower electrode 11 is formed by patterning so that each electrode corresponds to each of the pixels arranged. The lower electrode 11 is connected to TFT via a contact hole (not illustrated) formed in an interlayer insulating film that covers the TFT.

An insulating film 20 is provided to cover the peripheral portion of the lower electrodes 11. The insulating film 20 comprises, for example, an organic insulating material such as polyimide or photoresist, or an inorganic insulating material such as silicon oxide.

On the other hand, the upper electrode 18 provided above the lower electrode 11 is used as a cathode. When the lower electrode 11 is used as a cathode, the upper electrode is used as an anode.

When a display device 1 is a simple matrix type one, the upper electrode 18 is formed in stripes to cross the stripes of the lower electrode 11. Crossed portions of the lower electrode 11 and the upper electrode 18 constitute organic electroluminescence devices 5. Further, when the display device 1 is an active matrix type one, the upper electrode 18 is formed to cover substantially entire area of the substrate 3 and used as a common electrode for the pixels. For the display device 1 of active matrix type, a top emission type in which the light is taken out from the upper electrode 18 side is preferred because of high aperture of the organic electroluminescence device 5. In such a case, an auxiliary electrode (not illustrated) can be provided on the same level of the lower electrode 11 to prevent the voltage drop of the upper electrode 18.

As the anode material for the lower electrode 11 (or upper electrode 18), materials with high work function and high reflectance are preferred and they include, for example, nickel (Ni), silver (Ag), gold (Au), platinum (Pt), palladium (Pd), selenium (Se), rhodium (Rh), ruthenium (Ru), iridium (Ir), rhenium (Re), tungsten (W), molybdenum (Mo), chromium (Cr), tantalum (Ta), niobium (Nb), aluminum (Al), iron (Fe), cobalt (Co), copper (Cu), and alloys and oxides thereof, or tin oxide, ITO, zinc oxide, titanium oxide, etc.

On the other hand, as the cathode material for the upper electrode 18 (or lower electrode 11), materials with low work function are preferred and they include, magnesium (Mg), calcium (Ca), indium (In), lithium (Li), aluminum (Al), silver (Ag) or alloys, oxides or fluorides thereof and, for example, magnesium (Mg)-silver (Ag) alloy, lithium (Li)-fluorine (F) compound, lithium (Li)-oxygen (O) compound, etc.

For the electrode on the side of taking out light emission generated in the organic electroluminescence device 5, light transmitting materials are used among the materials described above.

For example, when the light emission is taken from the substrate 3 side, the lower electrode 11 is made of the material with high light transmittance such as ITO (Indium-Tin-Oxide) or IZO (Indium-Zinc-Oxide) and used for as the anode. And, the upper electrode 18 is made of the material with good reflectance such as aluminum.

On the other hand, when the light emission is taken from the upper electrode 18 side, the lower electrode 11 is made of the material such as chromium or silver alloy. And, the upper electrode 18 is made of the material with light transmittance such as an alloy of magnesium and silver (MgAg).

In the mean time, it is preferable that the organic electroluminescence device 5 constitutes a resonator structure in which the intensity of the light emission is increased. In this case, the upper electrode 18 is provided as a semi-transparent layer.

The structure of the organic layer 19 is to be described.

At first, the hole injecting layer 12 on the lower electrode 11 is provided as a common layer covering substantially whole area of the substrate 3. The hole injecting layer 12 comprising a usual hole injecting material, for example m-MTDATA [4,4,4-tris(3-methylphenyl phenylamino)triphenylamine], is vapor deposited with the thickness of 25 nm.

The hole transporting layer 13 is provided on the hole injecting layer 12 as a common layer covering substantially whole area of the substrate 3. The hole transporting layer 13 comprising a usual hole transporting material, for example α-NPD [4,4-bis(N-1-naphthyl-N-phenylamino) biphenyl], is vapor deposited with the thickness of 30 nm. Other materials for the hole transporting layer 13 include benzidine derivatives, styrylamino derivatives, triphenylmethane derivatives, hydrazone derivatives, etc.

Each of the hole injecting layer 12 and the hole transporting layer 13 may be of a laminate structure having plural layers.

A first light emitting layer 14 is provided on the hole transporting layer 13 as a common layer covering substantially whole area of the substrate 3. Such a first light emitting layer 14 emits light whose wavelength is equal to or shorter than that of blue light. The blue light means an emission color used as blue light in a final product of a display device. The first light emitting layer 14 comprises a host material and a light emitting dopant. For example, 4,4'-bis[2-[4-(N,N-diphenylamino) phenyl]vinyl] biphenyl (DPAVBi) as the blue light emitting dopant is mixed 2.5% by weight with AND (anthracene dinaphthyl).

The first light emitting layer 14 is provided by a vapor deposition method. The first light emitting layer 14 that emits light whose wavelength is shorter than that of blue light includes, for example, a simple AND or a combination of AND as a host material and BD-052X (manufactured by Idemitsu Kosan) as a dopant material (about 5% by weight). In both cases, emitted light is usually recognized as blue light.

A second light emitting layer 15 is provided on the first light emitting layer 14 for each of the organic electroluminescence devices 5 (5r, 5g, and 5b). That is, a red light emitting layer 15r emitting red light is provided as the second light emitting layer 15 in the red light emitting device 5r. A green light emitting layer 15g emitting a green light is provided as the second light emitting layer 15 in the green light emitting device 5g. A blue light emitting layer 15b emitting a blue light is provided as the second light emitting layer 15 in the blue light emitting device 5b.

The red light emitting layer 15r comprises, for example, a mixture of a host material and a red light emitting material. The red light emitting material may be either fluorescent or phosphorescent. In this embodiment, the red light emitting layer 15r includes AND and 2,6-bis [(4'-methoxydiphenylamino)styryl]-1,5-dicyano naphthalene (BSN) (30% by weight). The thickness of the red light emitting layer 15r is about 30 nm.

The green light emitting layer 15g comprises, for example, a mixture of a host material and a green light emitting material. The green light emitting material may be either fluorescent or phosphorescent. In this embodiment, the green light emitting layer 15g includes AND and coumarin 6 (5% by weight). The thickness of the red light emitting layer 15g is about 30 nm.

The blue light emitting layer 15b comprises, for example, a mixture of a host material and a blue light emitting material. The blue light emitting material may be either fluorescent or phosphorescent. In this embodiment, the blue light emitting layer 15b includes AND and 4,4'-bis[2-[4-(N,N-diphenylamino)phenyl]vinyl]biphenyl (DPAVBi) (2.5% by weight). The thickness of the red light emitting layer 15b is about 30 nm.

The second light emitting layers 15 (15r, 15g, and 15b) are provided with good positional accuracy by a thermal transfer method.

The electron transporting layer 16 is provided as a common layer on the second light emitting layer 15 to cover substantially whole area of the substrate 3. The electron transporting layer 16 including a general electron transporting material, for example 8-hydroxyquinoline aluminum (Alq3), is vapor deposited with thickness of about 20 nm.

The electron injecting layer 17 is provided as a common layer on the electron transporting layer 16 to cover substantially whole area of the substrate 3. The electron injecting layer 17 including a general electron injecting material, for example LiF, is vapor deposited with thickness of about 0.3 nm (vapor deposition rate: 0.01 nm/sec).

The upper electrode 18 is disposed on the electron injecting layer 17. The upper electrode 18 is provided as a common electrode. For example, MgAg is used as the upper electrode 18 and vapor deposited with thickness of 10 nm.

Then, a protective film 22 is provided on the upper electrode 18 to cover substantially whole area of the substrate 3. The protective film 22 is provided to prevent moisture from reaching the organic layer 19 with sufficient thickness using a low water-absorption material or a low water-permeable material. Further, when the display device is a top emission type, the protective film 22 is made of a material with good light transmissivity.

The material used for the protective film 22 may be either insulating or conductive. When using the insulating material, inorganic amorphous material, for examples, amorphous silicon ($\alpha$-Si), amorphous silicon carbide ($\alpha$-SiC), amorphous silicon nitride ($\alpha$-Si$_{1-x}$N$_x$), amorphous carbon ($\alpha$-C), etc. are preferably used. Since such inorganic amorphous materials do not form grains, and makes a good protective film with low water permeability.

For example, the protective film 22 comprising amorphous silicon nitride is provided by a CVD method with thickness of 2 to 3 µm.

Further, when the display device 1 is the active matrix type, the protective layer 22 may be formed with a conductive material such as ITO and IXO.

A protective substrate 24 is provided on the protective film 22 via a resin material for adhesion (not illustrated). As the resin material for adhesion, UV-ray curable resin is used for example. As the protective substrate 24, a glass substrate is used for instance. When the display device 1 is a top light emission type, the resin material for adhesion and the protective substrate 24 are made of a light transmitting material.

Furthermore, a color filter is additionally provided in a display device 1. For example, a color filter is disposed for each of the organic electroluminescence devices 5r, 5g, and 5b on the side from which light is taken out.

Then, a method of manufacturing the display device 1 is to be described with reference to a cross sectional step chart in FIG. 2.

Figure 2:
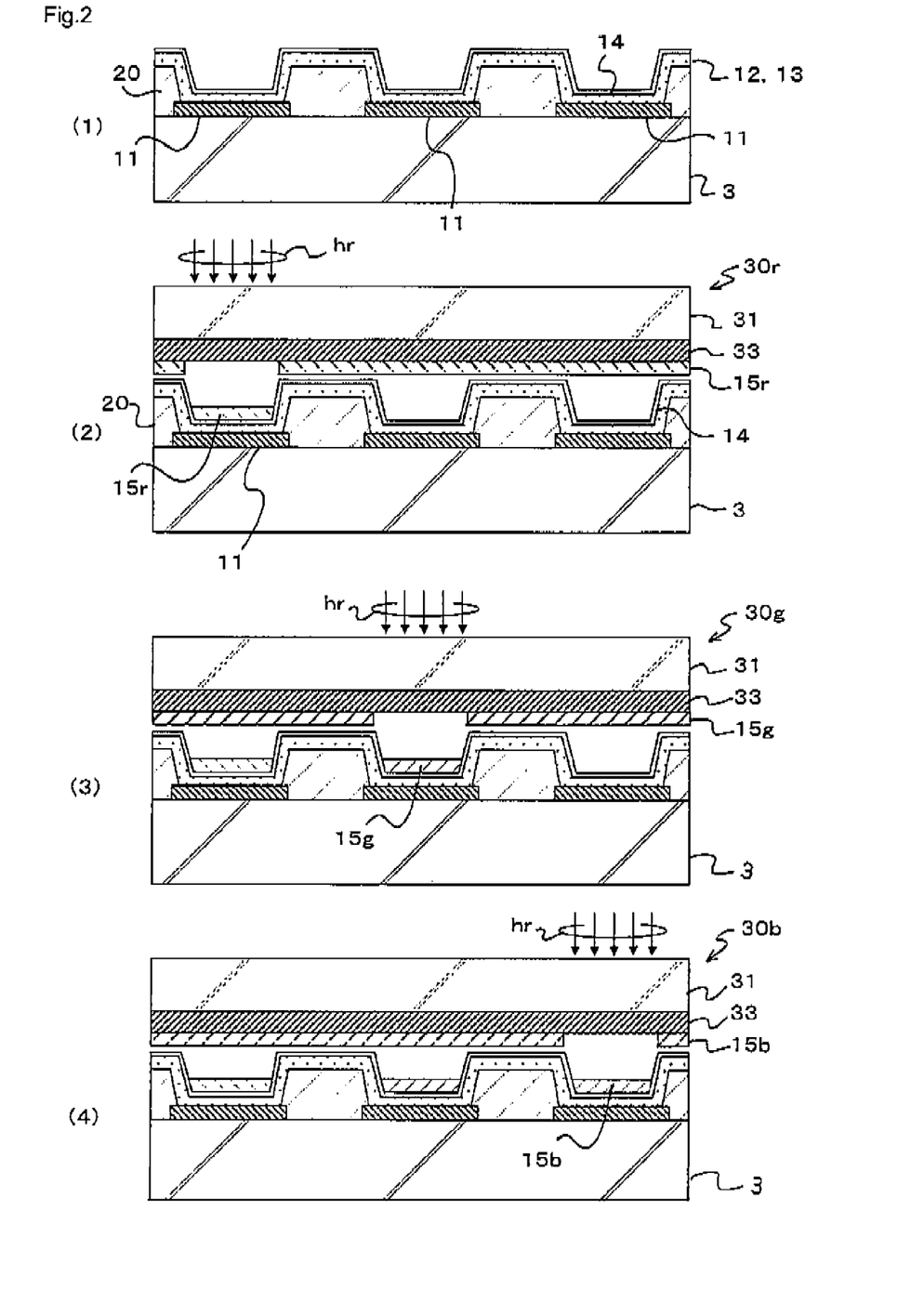
FIG. 2 is a cross sectional step charts showing a method of manufacturing a display device of the first embodiment.

At first, as shown in FIG. 2(1), a lower electrode 11 is provided on the substrate 3. An auxiliary electrode (not illustrated) may be optionally provided at the same time. Then, an insulating film 20 is provided to cover the peripheral portions of the lower electrode 11. Then, the hole injecting layer 12, the hole transporting layer 13, and the first light emitting layer 14 are provided successively to cover substantially whole area of the substrate 11 by a vapor deposition method. Each of the layers 12 to 14 is provided as a film without using a mask.

Then, as shown in FIG. 2(2), a transfer substrate 30r is prepared. In the transfer substrate 30r, a red light emitting layer 15r is provided via a light absorption layer 33 to cover substantially whole area of the glass substrate 31.

Then, the transfer substrate 30r is disposed being opposed to the substrate 3 having the first light emitting layer 14. In this case, the transfer substrate 30r and the substrate 3 are disposed such that the red light emitting layer 15r and the first light emitting layer 14 are opposed to each other. The substrate 3 and the transfer substrate 30r may be disposed to contact with each other so that the first light emitting layer 14 on the substrate 3 and the red light emitting layer 15r on the transfer substrate 30r are in contact with each other.

Then, a laser light hr with a wavelength, for example, of 800 nm is irradiated from the side of the transfer substrate 30r. In this case, the laser light hr is selectively irradiated spotwise to the region for the red light emitting device. The laser is absorbed by the light absorption layer 33 and the red light emitting layer 15r is thermally transferred selectively on the first light emitting layer 14 on the substrate 3.

Then, a green light emitting layer and a blue light emitting layer are provided by repeating the above steps of the thermal transfer.

That is, as shown in FIG. 2(3), a transfer substrate 30g with a light absorption layer 33 and a green light emitting layer 15g is prepared, and the green light emitting layer 15g is thermally and selectively transferred on the first light emitting layer 14 on the substrate 3.

Further, as shown in FIG. 2(4), a transfer substrate 30b with a light absorption layer 33 and a blue light emitting layer 15b is prepared, and a blue light emitting layer 15b is thermally and selectively transferred on the first light emitting layer 14 on the substrate 3.

Each of the thermal transfer steps described with reference to FIG. 2(2) to FIG. 2(4) may be conducted in an optional order for the light emitting layers (15r, 15g, and 15b).

Further, the thermal transfer steps is preferably conducted in vacuum while they can also be conducted in an atmospheric air. By conducting in vacuum, transfer is possible with lower energy of laser and thermal damages given to the light emitting layer to be transferred can be mitigated. Further, by conducting the thermal transfer step in vacuum, both substrates can be closely attached and the patterning accuracy is improved. In addition, by conducting all of the processes continuously in vacuum, degradation of the device can be prevented.

After forming the second light emitting layers 15r, 15g and 15b, the electron transporting layer 16 and the electron injecting layer 17 are provided to cover substantially whole area of the substrate 3 by a vapor deposition method as shown in FIG. 1. Then, the upper electrode 18 and a protective film 22 are formed by a film forming method, for example, a vapor deposition method or a CVD (chemical vapor deposition) method.

Each of the layers 16 to 22 is formed as a film without using a mask. Further, each of the layers 16 to 22 is preferably formed continuously in one identical film forming apparatus with no exposure to atmospheric air. This can prevent degradation of the organic layer 19 caused by moisture in atmospheric air.

When the auxiliary electrode is provided, the organic layers formed as a film on the lower electrode 11 may be partially removed by a laser abrasion method or the like before forming the upper electrode 18. This connects the upper electrode 18 directly to the lower electrode 11 to improve the state of contact.

Finally, a protective substrate 24 is provided to complete a display device 1.

According to the first embodiment, there is provided a light emitting layer provided by the vapor deposition method, that is, a first light emitting layer 14 being free of damages by thermal transfer and having high re-combination probability between electrons and holes.

Then, in the organic electroluminescence devices 5 (5r, 5g, and 5b), the second light emitting layers 15r, 15g, and 15b are further provided. In the red light emitting device 5r and the green light emitting device 5g having the red light emitting layer 15r or the green light emitting layer 15g that emit light whose wavelength is longer than that of a first light emitting layer 14, the re-combination energy of the first light emitting layer 14 rapidly moves to the second light emitting layer 15r or 15g and contributes to the emission of the red light or the green light.

On the other hand, in the blue light emitting device 5b having the blue light emitting layer 15b and the first light emitting layer 14, since the first light emitting layer 14 formed by vapor deposition mainly acts as an emitting layer, the light emission efficiency and the luminance life are maintained at high levels. Also in case the first light emitting layer 14 emits light whose wavelength is shorter than that of blue light, light is emitted according to the same principle for the red light emitting device 5r and the green light emitting device 5g described above. That is, the re-combination energy at good efficiency generated in the first light emitting layer 14 rapidly moves to the blue light emitting layer 15b to emit blue light.

The second light emitting layers 15r, 15g, and 15b are provided by thermal transfer. Accordingly, the light emitting layer of each of the organic electroluminescence devices 5r, 5g, and 5b is formed with good positional accuracy.

As the result, the pattern formation is possible with good positional accuracy, and the blue light emitting device 5b is obtained with increased life and high light emission efficiency.

Second Embodiment

Figure 3:
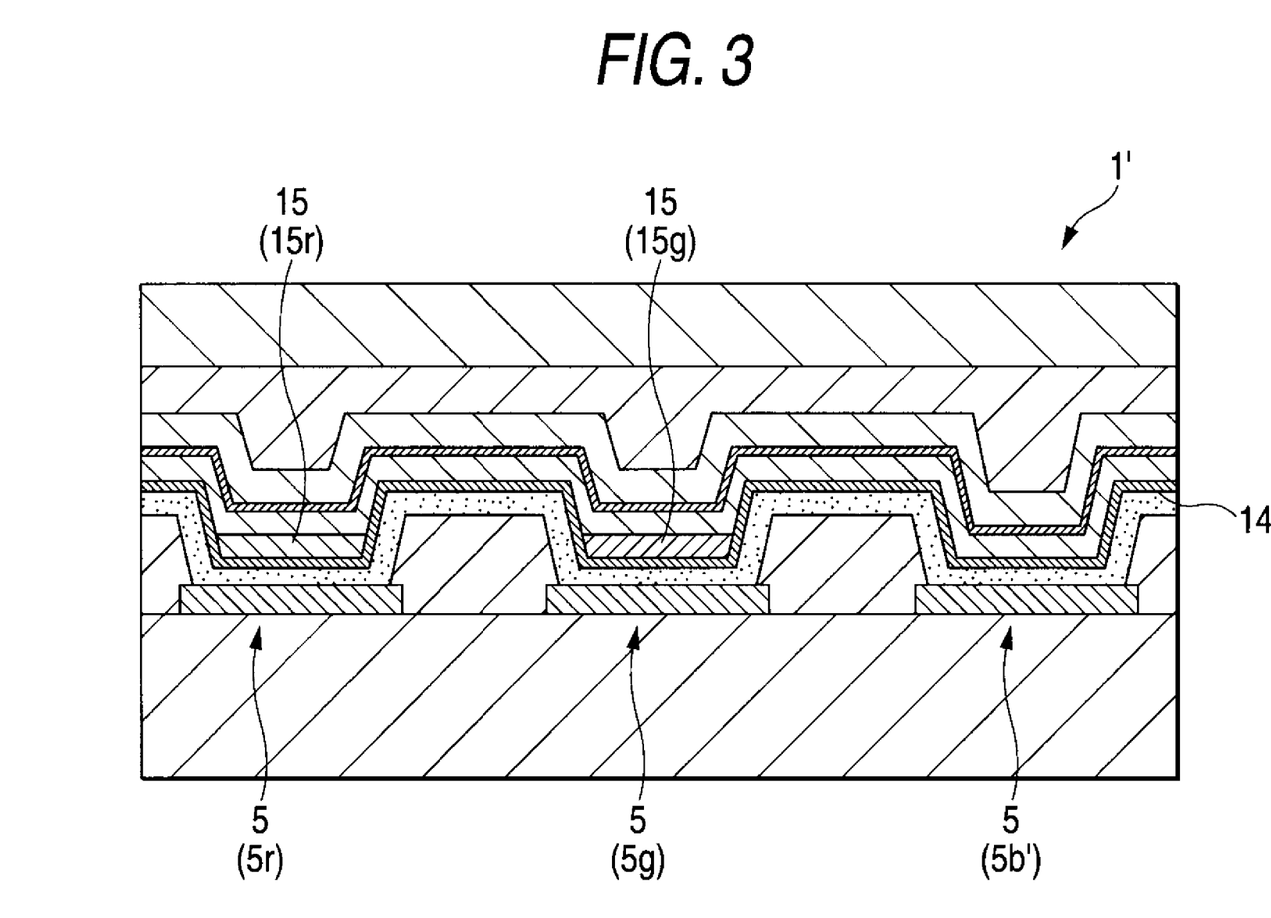
FIG. 3 is a cross sectional view showing the structure of a display device in accordance with a second embodiment.

FIG. 3 is a cross sectional view for a main portion of a display device as a second embodiment according to the invention. A display device 1' in FIG. 3 is different from the display device 1 in FIG. 1 in that a blue light emitting device 5b' has no second light emitting layer.

That is, a light emitting layer of a blue light emitting device 5b' has only the first light emitting layer 14. In the display device 1, the first light emitting layer 14 emits light whose wavelength is equal to or shorter than that of blue light. In the display device 1', the first light emitting layer 14 emits blue light.

Also in this embodiment, the first light emitting layer 14 formed by vapor deposition emits blue light efficiently. Therefore, the same effect as the first embodiment can be obtained.

In addition, according to the second embodiment, since thermal transfer steps are necessary only twice, the manufacturing process can be simplified.

This invention is applicable to the embodiments in which the lower electrode 11 is used as the cathode and the upper electrode 18 is used as the anode.

This invention is also applicable to the embodiments in which the first light emitting layer is laminated on the second light emitting layer.

Furthermore, this invention is applicable to the embodiments in which the second light emitting layer is formed by other than thermal transfer, so long as the pattern can be formed with good accuracy.

Furthermore, this invention is applicable to a tandem organic EL device including plural units of organic layers each having a light emitting layer (light emitting units).

EXAMPLE

Specific examples of the invention and comparative examples are shown below.

Example 1

A red light emitting organic electroluminescence device 15r was prepared (refer to FIG. 1).

(1) At first, above a glass substrate as a device forming substrate, an APC (Ag—Pd—Cu) layer as a silver alloy layer (film thickness: 120 nm), and an ITO film as a transparent conductive layer (film thickness: 10 nm) were formed in this order to form a lower electrode 11 of a two-layered structure. Then, an insulating film 20 of silicon oxide was formed to a thickness of about 2 μm by a sputtering method in a state of covering the circumferential edge of the lower electrode 11. Then, the lower electrode 11 was exposed by lithography, on which m-MTDATA was vapor deposited at a film thickness of 25 nm as the hole injecting layer 12, and α-NPD was vapor deposited to a film thickness of 30 nm as the hole transporting layer 13.

(2) As the first light emitting layer 14, a host material AND mixed with 2.5% by weight of DPAVBi as a dopant material was vapor deposited to a film thickness of 5 nm.

(3) On the other hand, a transfer substrate was prepared. At first, a light absorption layer comprising chromium with thickness of 200 nm was formed on a glass substrate by a usual sputtering method. On the light absorption layer, AND as the host material mixed with 30% by weight of 2,6-bis[(4'-methoxydiphenylamino)styryl]-1,5-dicyano naphthalene (BSN) as a dopant material was formed to a film thickness of about 30 nm.

(4) Then, in the state where the formed films of organic layers are opposed to each other, the transfer substrate prepared in (3) was placed above the device preparing substrate 3 and adhered closely in vacuum. Both of the substrates were kept at a small distance of about 2 μm by the thickness of the insulating film 20. In this state, by irradiating a laser light at a wavelength of 800 nm from the back of the transfer substrate in an arrangement opposing to the red light pixel region of the device forming substrate 3, the red light emitting layer 15r was thermally transferred from the transfer substrate. The spot size for the laser light was controlled to 300 μm×10 μm. The laser light was scanned in the direction perpendicular to the longitudinal size of the light. The energy density was at 2.6 E-3 mJ/μm².

(5) As the electron transporting layer 16, 8-hydroxyquinoline aluminum (Alq3) was vapor deposited to a film thickness of about 20 nm. Successively, as the electron injecting layer 17, LiF was vapor deposited to a film thickness of about 0.3 nm (vapor deposition rate: 0.01 nm/sec). Then, as the upper electrode 18, MgAg was vapor deposit to a film thickness of 10 nm.

Example 2

A green light emitting organic electroluminescence device 15g was prepared.

The same procedures as those in Example 1(1), (2) were conducted.

In Example 1(3), AND as the host material mixed with 5% by weight of coumarin 6 was formed as a green emitting layer instead of the red light emitting layer to a film thickness of about 30 nm.

Then, the same procedures as those in Example 1(4), (5) were conducted by using the transfer substrate prepared as described above.

Example 3

A blue light emitting organic electroluminescence device 15b was prepared.

The same procedures as those in Example 1(1), (2) were conducted.

In Example 1(3), AND as the host material mixed with 2.5% by weight of DPAVBi as the dopant material was formed to a thickness of about 30 nm as the blue light emitting layer instead of the red light emitting layer.

Then, the same procedures as those in Example 1(4), (5) were conducted by using the transfer substrate prepared as described above.

Example 4

A blue light emitting organic electroluminescence device 15b' was prepared.

In this case, only the procedures (1), (2), and (5) in Example 1 were conducted to prepare a blue light emitting device 15b' in which the light emitting layer was constructed only with the blue light emitting first light emitting layer 14 (refer to FIG. 3).

Comparative Example 1

The procedures in Example 1, procedures (1), (3), (4) and (5) were conducted successively while saving the procedure (2) to prepare an organic electroluminescence device in which the light emitting layer was constructed only with the red light emitting layer 15r without disposing the first light emitting layer 14.

Comparative Example 2

The procedures in Example 2, procedures (1), (3), (4) and (5) were conducted successively while saving the procedure (2) to prepare an organic electroluminescence device in which the light emitting layer was constructed only with the green light emitting layer 15g without disposing the first light emitting layer 14.

Comparative Example 3

In the procedures in Example 3, procedures (1), (3), (4) and (5) were conducted successively while saving the procedure (2) to prepare an organic electroluminescence device in which the light emitting layer was constructed only with the blue light emitting layer 15b without disposing the first light emitting layer 14.

Result of Evaluation

For the organic electroluminescence devices prepared as described above, in a state of applying a constant current at a density of 10 mA/cm², the light emission efficiency and the chromaticity were measured by using a spectral radiance meter. Further, a life test was conducted in a state of setting the current application such that devices using the identical dopant emitted light at an identical luminance and the rate of decrease in the relative luminance after lapse of 100 hrs was measured. The results are shown in the following Table 1.

TABLE 1

| | Device constitution | CIE chromaticity (x, y) | Light emission efficiency [cd/A] | Rate of decrease in luminance (%) |
|---|---|---|---|---|
| Example 1 | Red light emitting device 5r | (0.64, 0.32) | 5.3 | 15 |
| (Comp. Example 1) | Red light emitting device | (0.63, 0.32) | 5.5 | 17 |
| Example 2 | Green light emitting device 5g | (0.22, 0.68) | 13 | 15 |
| (Comp. Example 2) | Green light emitting device | (0.22, 0.66) | 15 | 14 |
| Example 3 | Blue light emitting device 5b | (0.16, 0.21) | 6.2 | 11 |
| (Comp. Example 3) | Blue light emitting device | (0.16, 0.20) | 3.6 | 46 |
| Example 4 | Blue light emitting device 5b' | (0.16, 0.21) | 3.3 | 25 |

(Comparative Example): with no first light emitting layer

When comparing the result of evaluation between Example 1 and Comparative Example 1, it was confirmed that the chromaticity and the light emission efficiency were obtained about at the same extent and the rate of decrease in the luminance was also suppressed by about the same extent also for the red light emitting device 5r of Example 1 provided with the blue light emitting first emitting layer, as those for the red light emitting device of Comparative Example 1 not provided with the first light emitting layer. This was identical also in the comparison between the green light emitting devices of Example 2 and Comparative Example 2.

This is considered to be attributable to that the light was scarcely emitted in the first light emitting layer 14 since the light emission from the first light emitting layer 14 disposed in Examples 1, 2 was at a short wavelength of high energy and the re-combination energy in the first light emitting layer 14 conducted rapidly to the red light emitting layer 15r and the green light emitting layer 15g.

On the other hand, when comparing the result of evaluation between Example 3 and Comparative Example 3, it was confirmed that the light emission efficiency increased twice or more and also the rate of decrease in the luminance was suppressed to ¼ or less for the blue light emitting device 5b of Example 3 provided with the blue light emitting first light emitting layer compared with the blue light emitting device of Comparative Example 3 not provided with the first light emitting layer. Further, degradation of the chromaticity was not observed as well.

In view of the result described above, it was confirmed that the characteristics of the blue light emitting device 5g could be improved while maintaining the characteristics of the red light emitting device 5r and the green light emitting 5b in the display devices in which the organic electroluminescence devices 5r, 5g and 5b for each of the colors in Examples 1 to 3. This enables to favorably maintain the characteristics of the organic electroluminescence devices 5r, 5g, and 5b emitting for each of the colors in full color display devices using the organic electroluminescence devices by forming the second light emitting layers 15r, 15g, and 15b by the thermal transfer.

Further, when comparing the result of evaluation between Example 4 and Comparative Example 3, it was confirmed that the rate of decrease in the luminance was suppressed to about ½ in the blue light emitting device 5b' of Example 3 in which the light emitting layer was constructed only with the blue light emitting first light emitting layer, compared with the blue light emitting device of Comparative Example 3 not provided with the first light emitting layer. Further, degradation of the chromaticity was not observed and it was confirmed that lowering of the light emission efficiency could also be restricted.

Accordingly, it was confirmed that the life of the blue light emitting device 5b' could be increased by constructing the light emitting layer only with the first light emitting layer formed by vapor deposition.

It should be understood by those skilled in the art that various modifications, combinations, sub-combinations and alterations may occur depending on design requirements and other factors insofar as they are within the scope of the appended claims or the equivalents thereof.

What is claimed is:

1. A display device having:
   a plurality of organic electroluminescence devices arranged on a substrate, each of the organic electroluminescence devices including a lower electrode, an organic layer containing at least one light emitting layer, and an upper electrode in this order,
   wherein
   at least three of said organic electroluminescence devices, each of which emits a different color, have a common first light emitting layer,
   at least one of said at least three organic electroluminescence devices has a second light emitting layer which is stacked above said first light emitting layer,
   the first light emitting layer emits light with a wavelength that is equal to or shorter than that of blue light,
   the at least three of said organic electroluminescence devices have in common, distinctly from the first light emitting layer, a hole injecting layer, a hole transporting layer, an electron injecting layer and an electron transporting layer,
   the hole injecting and transport layers are located below the first light emitting layer and the second light emitting layer, and
   the electron injecting and transport layers are located above the first light emitting layer and the second light emitting layer.

2. The display device according to claim 1, wherein the second light emitting layer emits light whose wavelength is equal to or longer than that of blue light.

3. The display device according to claim 1, wherein the organic electroluminescence devices emit red light, green light, or blue light respectively.

4. The display device according to claim 3, wherein:
   the red light emitting organic electroluminescence device includes a red light emitting layer that emits a red light as the second light emitting layer and the first light emitting layer,
   the green light emitting organic electroluminescence device includes a green light emitting layer that emits a green light as the second light emitting layer and the first light emitting layer, and
   the blue light emitting organic electroluminescence device includes only the first light emitting layer.

5. The display device according to claim 3, wherein:
   the red light emitting organic electroluminescence device includes a red light emitting layer that emits a red light as the second light emitting layer and the first light emitting layer,
   the green light emitting organic electroluminescence device includes a green light emitting layer that emits a green light as the second light emitting layer and the first light emitting layer, and
   the blue light emitting organic electroluminescence device includes a blue light emitting layer that emits a blue light as the second light emitting layer and the first light emitting layer.

6. The display device according to claim 4, wherein the first light emitting layer is provided by a vapor deposition process and the second light emitting layer is provided by a thermal transfer process.

7. The display device according to claim 5, wherein the first light emitting layer is provided by a vapor deposition process and the second light emitting layer is provided by a thermal transfer process.

8. A method of manufacturing a display device having a plurality of organic electroluminescence devices arranged on a substrate, each of the organic electroluminescence devices includes a lower electrode, an organic layer containing at least one light emitting layer, and an upper electrode in this order, comprising:
   forming a lower electrode over a substrate;
   forming a hole injecting layer and a hole transporting layer on the electrode;
   forming, via a vapor deposition process, a first light emitting layer that emits light with a wavelength that is equal to or shorter than that of blue light so that at least three of said organic electroluminescence devices, each of which emits a different color, have said first light emitting layer in common;
   forming, via a thermal transfer process, a second light emitting layer that emits light with a wavelength that is equal to or longer than that of blue light so that at least one but not all of said three organic electroluminescence devices has a light emitting layer with a laminated structure of said first light emitting layer and the second light emitting layer, said second light emitting layer being positioned above said common first light emitting layer; and forming an electron injecting layer and an electron transporting layer across the plurality of organic electroluminescence devices.

9. A display device comprising:

a substrate; and at least three organic electroluminescent devices in said substrate, wherein, said organic electroluminescence devices, each of which emits a different color, share in common at least one organic electroluminescent light emitting layer, a hole injecting layer, a hole transporting layer, an electron injecting layer and an electron transporting layer, two of said organic electroluminescence device also include respective, unique, organic electroluminescence light emitting layers, said unique organic electroluminescence light emitting layers are located above said common organic electroluminescent light emitting layer, said two organic electroluminescence devices emit at least one of red and green light, one of said organic electroluminescence devices other than said two of said organic electroluminescence devices emits blue light, the hole injecting and transport layers formed below the common organic electroluminescent light emitting layer and said unique organic electroluminescence light emitting layers, and the electron injecting and transport layers are located above the common organic electroluminescent light emitting layer and said unique organic electroluminescence light emitting layers.

10. The display device according to claim 1, wherein the common first light emitting layer is in contact with and substantially covers an entire surface of the hole injecting and transport layer.

11. The method according to claim 8, wherein the common first light emitting layer is in contact with and substantially covers an entire surface of the hole injecting and transport layer.

12. The display device according to claim 9, wherein the common first light emitting layer is in contact with and substantially covers an entire surface of the hole injecting and transport layer.

* * * * *